US010824080B2

(12) United States Patent
Shih et al.

(10) Patent No.: US 10,824,080 B2
(45) Date of Patent: Nov. 3, 2020

(54) METHOD TO REDUCE NATIVE DEFECT PRINTABILITY

(71) Applicant: TAIWAN SEMICONDUCTOR MANUFACTURING CO., LTD., Hsinchu (TW)

(72) Inventors: Chih-Tsung Shih, Hsinchu (TW); Tsung-Chih Chien, Caotun Township (TW); Tsung Chuan Lee, Taipei (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/663,214

(22) Filed: Oct. 24, 2019

(65) Prior Publication Data

US 2020/0133141 A1    Apr. 30, 2020

Related U.S. Application Data

(60) Provisional application No. 62/753,895, filed on Oct. 31, 2018.

(51) Int. Cl.
*G03F 7/20*  (2006.01)
(52) U.S. Cl.
CPC ............................. *G03F 7/70641* (2013.01)

(58) Field of Classification Search
CPC ........ G03F 7/70341; G03F 1/24; G03F 7/702; G03F 7/70033; G03F 7/70641
See application file for complete search history.

(56) References Cited

U.S. PATENT DOCUMENTS

| | | | |
|---|---|---|---|
| 7,390,596 B2 | 6/2008 | Ishibashi et al. | |
| 7,981,573 B2 | 7/2011 | Ishibashi et al. | |
| 8,748,063 B2* | 6/2014 | Gallagher | G03F 1/22 382/144 |
| 8,877,409 B2 | 11/2014 | Hsu et al. | |
| 9,354,510 B2 | 5/2016 | Yu et al. | |
| 2002/0096647 A1* | 7/2002 | Moors | G03F 7/70558 250/492.1 |
| 2004/0027293 A1 | 2/2004 | Miyake et al. | |
| 2018/0106831 A1 | 4/2018 | Budach et al. | |
| 2018/0158653 A1 | 6/2018 | Liao | |
| 2019/0267211 A1 | 8/2019 | Pan et al. | |

* cited by examiner

*Primary Examiner* — Steven Whitesell Gordon
(74) *Attorney, Agent, or Firm* — McDermott Will & Emery LLP (57) ABSTRACT

A method includes reducing refractive index of an environment at or adjacent an extreme ultraviolet (EUV) mask to below 1.0. The EUV mask is in an EUV lithography system that forms a projection beam of EUV radiation using EUV radiation emitted from a radiation source. The method further includes exposing the EUV mask to the projection beam of EUV radiation.

20 Claims, 11 Drawing Sheets

METHOD TO REDUCE NATIVE DEFECT PRINTABILITY

CROSS REFERENCE TO RELATED APPLICATION

This application claims priority of U.S. Provisional Patent Application No. 62/753,895 filed on Oct. 31, 2018, the entire contents of which are incorporated herein by reference.

BACKGROUND

Defects in extreme ultra-violet (EUV) masks result in imaging errors of the semiconductor wafers illuminated using the EUV masks. Moreover, defects in or on the substrate and/or in the multi-layer (ML) structure of the EUV mask also result in imaging errors of the structural elements which are imaged by the EUV mask on a semiconductor wafer. Defects on the mask include pits and scratches on the mask blank. Scratches may originate from chemical mechanical polishing (CMP) of substrates and pits may be generated by cleaning processes before multi-layer (ML) deposition. The scratches and pits cause optically destructive interference in the reflecting EUV radiation. While defects can be minimized by flattening (polishing) the ML, the defects cannot be completely eliminated.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Masks (also referred to as photomasks or reticles) are used in extreme ultra-violet (EUV) lithography systems for transferring circuit patterns (e.g., the design of a layer of an integrated circuit (IC) device) onto a semiconductor wafer. The circuit patterns are transferred over and over onto multiple wafers through various lithography processes. Several masks (for example, a set of 15 to 30 masks) may be used to construct a complete IC device.

An EUV mask includes a substrate with a suitable material, such as a low thermal expansion material (LTEM) or fused quartz. In various embodiments, the LTEM includes $TiO_2$ doped $SiO_2$, or other suitable materials with low thermal expansion. A multi-layer (ML) structure including 40 to 60 double layers of silicon (Si) and molybdenum (Mo) is deposited on the substrate. Apart from the substrate and the multi-layer structure, EUV masks additionally have a capping layer arranged on the multi-layer structure for minimizing oxidation of the multi-layer (ML) structure and a patterned absorber structure arranged on the capping layer for absorbing impinging EUV photons.

As a consequence of the extremely small wavelength of the extreme ultra-violet radiation, defects in or on the substrate and/or in the multi-layer structure result in imaging errors of the structural elements which are imaged by the EUV mask on a wafer. The defects cause destructive optical interference in the radiation reflecting from the EUV mask and affect the critical dimension (CD) on the semiconductor wafer. The destructive optical interference may cause a bright area to become dark area. Stated otherwise, the intensity of the EUV radiation reflected from the location (area) of the EUV mask having the defect is reduced. While flattening of the multi-layer and/or the substrate can reduce such defects, and thereby reduce the effects on the semiconductor wafer to some extent, the effects on the semiconductor wafer cannot be completely eliminated and thus it is desirable to further mitigate the effect.

Embodiments disclosed are directed to systems and methods using a plasma for reducing refractive index of the environment around the EUV mask.

Figure 1:
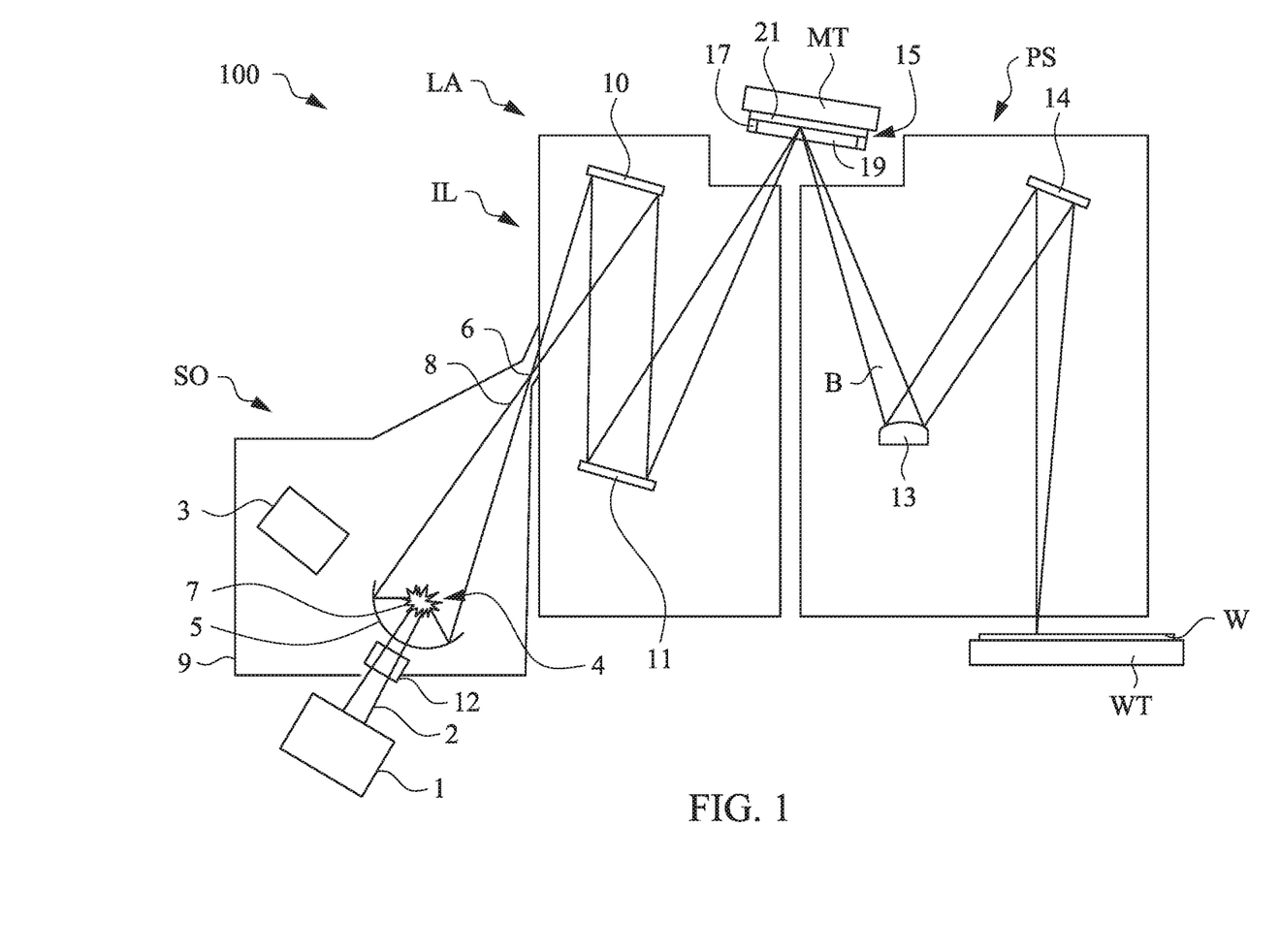
FIG. 1 illustrates an extreme ultraviolet lithography system, according to some embodiments.

FIG. 1 shows an extreme ultraviolet lithography system 100 for implementing some of the concepts disclosed herein. The extreme ultraviolet lithography system 100 includes a radiation source SO and a lithographic apparatus LA. The radiation source SO is configured to generate an extreme ultraviolet (EUV) radiation beam B. The lithographic apparatus LA includes an illumination system IL, a mask support structure MT, a projection system PS, and a substrate table WT configured to support a substrate W. The illumination system IL is configured to condition the radiation beam B before it is incident upon a patterning device 21 which is alternatively referred to as a mask or a reticle (hereinafter, referred to as mask 21). The mask 21 includes a transmissive mask or a reflective mask. For the purposes of discussion herein, the mask 21 is considered to be a reflective mask. However, embodiments disclosed herein are equally applicable to EUV systems that use a transmissive mask. The support structure MT includes for example, a chuck for supporting the mask 21. The projection system PS is configured to project the radiation beam B (now patterned by the mask 21) onto the substrate W.

The radiation source SO, illumination system IL, and projection system PS are constructed and arranged such that they can be isolated from the external environment. A gas at a pressure below atmospheric pressure (e.g. hydrogen) may be provided in the radiation source SO. A vacuum is provided in the illumination system IL and/or the projection system PS. A small amount of gas (e.g. hydrogen) at a pressure well below atmospheric pressure may be provided in the illumination system IL and/or the projection system PS.

The radiation source SO shown in FIG. 1 is a laser produced plasma (LPP) source. A laser 1, which may be a $CO_2$ laser, is arranged to deposit energy via a laser beam 2 into a target droplet, such as a tin (Sn) droplet that is provided from a target droplet generator 3. Although tin is referred to in the following description, any suitable target droplet material may be used. The target droplet material may be in liquid form, and may be a metal or alloy. The target droplet generator 3 may include a nozzle configured to direct tin in the form of droplets, along a trajectory towards a plasma formation region 4. The laser beam 2 is incident upon the tin at the plasma formation region 4. The absorption of laser energy by the tin creates a plasma 7 at the plasma formation region 4. Radiation, including EUV radiation, is emitted from the plasma 7 during de-excitation and recombination of ions of the plasma.

The EUV radiation is collected and focused by a near normal incidence radiation collector 5 (also referred to as a collector). The collector 5 may have a multi-layer structure that is arranged to reflect EUV radiation (e.g. EUV radiation having a desired wavelength such as 13.5 nm). The collector 5 may have an elliptical configuration, having two ellipse focal points. A first focal point may be at the plasma formation region 4, and a second focal point may be at an intermediate focus 6, as discussed below.

In other embodiments, the collector 5 includes a grazing incidence collector that is configured to receive EUV radiation at grazing incidence angles and focus the EUV radiation at an intermediate focus. A grazing incidence collector may be a nested collector, including a plurality of grazing incidence reflectors. The grazing incidence reflectors may be disposed axially symmetrically around an optical axis.

The radiation source SO includes one or more contamination traps (not shown). A contamination trap is located between the plasma formation region 4 and the radiation collector 5. The contamination trap is a rotating foil trap, or any other suitable form of contamination trap.

The laser 1 is separated from the radiation source SO in some embodiments. Where this is the case, the laser beam 2 is passed from the laser 1 to the radiation source SO with the aid of a beam delivery system (not shown) including suitable directing mirrors and/or a beam expander, and/or other optics. The laser 1 and the radiation source SO are together considered to be a radiation source system.

Radiation that is reflected by the collector 5 forms a radiation beam B. The radiation beam B is focused at point 6 to form an image of the plasma formation region 4, which acts as a virtual radiation source for the illumination system IL. The point 6 at which the radiation beam B is focused is referred to as the intermediate focus. The radiation source SO is arranged such that the intermediate focus 6 is located at or near to an opening 8 in an enclosing structure 9 of the radiation source.

The radiation beam B passes from the radiation source SO into the illumination system IL, which is configured to condition the radiation beam. The illumination system IL includes a facetted field mirror device 10 and a faceted pupil mirror device 11. The faceted field mirror device 10 and faceted pupil mirror device 11 together provide the radiation beam B with a desired cross-sectional shape and a desired angular distribution. The radiation beam B passes from the illumination system IL and is incident upon the mask 21 held by the support structure MT. The mask 21 is protected by a pellicle 19, which is held in place by a pellicle frame 17. The assembly including the support structure MT, the mask 21, the pellicle 19, and the pellicle frame 17 together form the reticle stage (RS). The mask 21 reflects and patterns the radiation beam B. The illumination system IL includes other mirrors or devices in addition to or instead of the faceted field mirror device 10 and faceted pupil mirror device 11.

Following reflection from the mask 21, the patterned radiation beam B enters the projection system PS. The projection system includes a plurality of mirrors that are configured to project the radiation beam B onto a semiconductor substrate W held by the substrate table WT. In some embodiments, the projection system PS applies a reduction factor to the radiation beam, forming an image with features that are smaller than the corresponding features on the mask 21. Although the projection system PS, as shown, has two mirrors in FIG. 1, the projection system may include any number of mirrors (e.g. six mirrors).

The lithographic apparatus LA may be used in a scan mode, wherein the support structure (e.g. mask table or chuck) MT and the substrate table WT are scanned synchronously while a pattern imparted to the radiation beam is projected onto a substrate W (i.e. a dynamic exposure). The velocity and direction of the substrate table WT relative to the support structure (e.g. mask table) MT is determined by the demagnification and image reversal characteristics of the projection system PS. The patterned radiation beam that is incident upon the substrate W includes a band of radiation. The band of radiation is referred to as an exposure slit. During a scanning exposure, the movement of the substrate table WT and the support structure MT is such that the exposure slit travels over an exposure field of the substrate W.

The radiation source SO and/or the lithographic apparatus that is shown in FIG. 1 may include components that are not illustrated. A spectral filter is provided in the radiation source SO in some embodiments. The spectral filter is substantially transmissive for EUV radiation but substantially blocks other wavelengths of radiation such as infrared radiation.

In other embodiments of the lithographic system, the radiation source SO includes one or more free electron lasers. The one or more free electron lasers are configured to emit EUV radiation that is provided to one or more lithographic apparatus.

The pellicle assembly 15 includes a pellicle 19 that is provided adjacent to the mask 21. The pellicle 19 is provided in the path of the radiation beam B such that radiation beam B passes through the pellicle 19 both as it approaches the mask 21 from the illumination system IL and as it is reflected by the mask 21 towards the projection system PS. The pellicle 19 includes a thin film that is substantially transparent to EUV radiation (although a small amount of EUV radiation may be absorbed). The pellicle 19 protects the mask 21 from particle contamination.

While efforts may be made to maintain a clean environment inside the lithographic apparatus LA, particles may still be present inside the lithographic apparatus LA. In the absence of a pellicle 19, particles may be deposited onto the mask 21. The pellicle 19 advantageously provides a barrier between the mask 21 and the environment in the lithographic apparatus LA in order to prevent particles from being deposited on the mask 21.

The pellicle 19 is positioned at a distance from the mask 21 that is sufficient so that any particles that are incident upon the surface of the pellicle 19 are not in the focal plane of the radiation beam B. This separation between the pellicle 19 and the mask 21, acts to reduce the extent to which any particles on the surface of the pellicle 19 impart a pattern to the radiation beam B. It will be appreciated that where a particle is present in the beam of radiation B, but at a position that is not in a focal plane of the beam of radiation B (i.e., not at the surface of the mask 21), then any image of the particle will not be in focus at the surface of the substrate W. In some embodiments, the separation between the pellicle 19 and the mask 21 is between about 2 mm and about 3 mm (e.g. about 2.5 mm).

Figure 2:
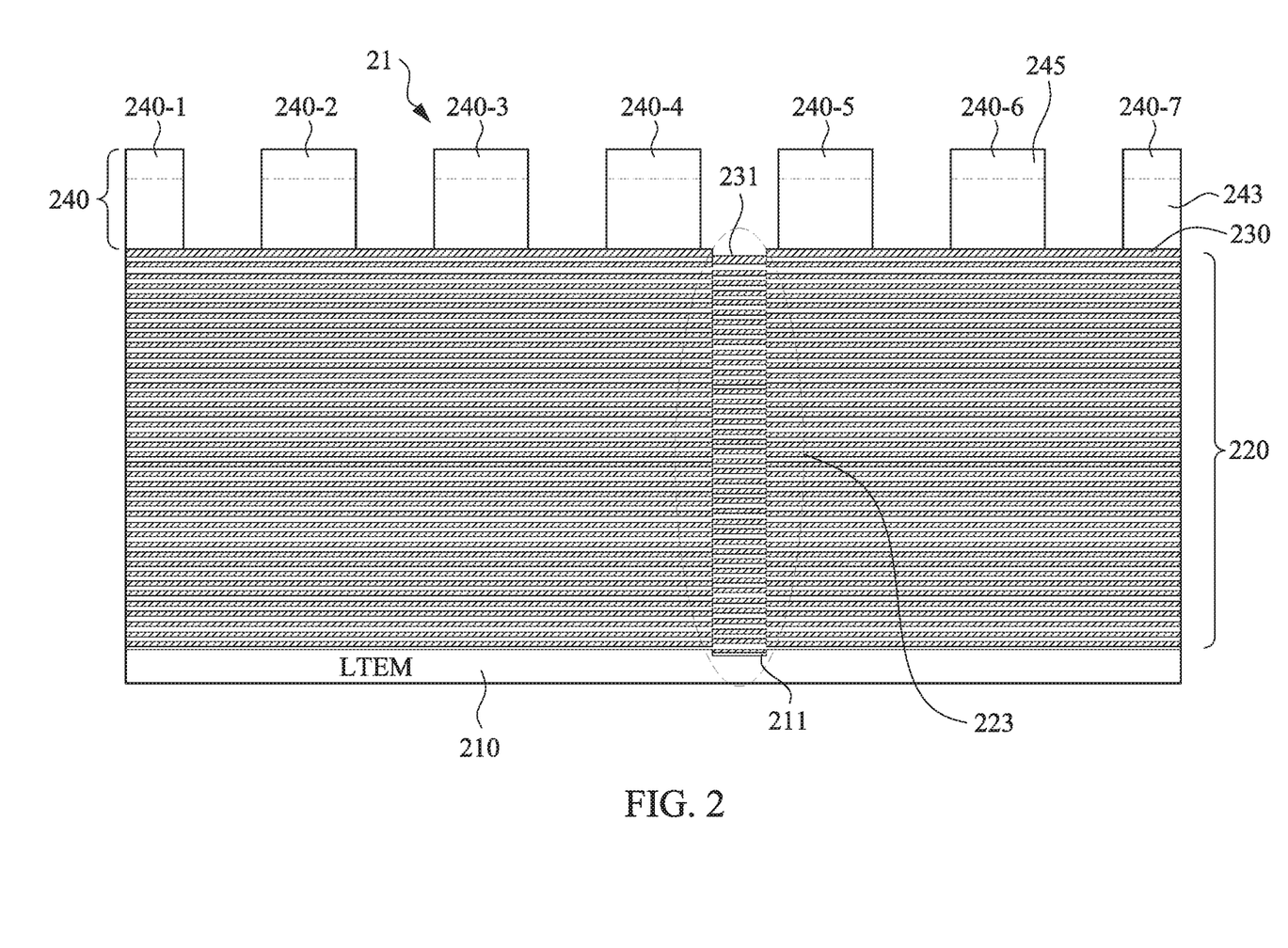
FIG. 2 illustrates a diagrammatic cross-sectional side view of the extreme ultra-violet (EUV) mask in FIG. 1, according to some embodiments.

FIG. 2 illustrates a diagrammatic cross-sectional side view of the extreme ultra-violet (EUV) mask 21 of FIG. 1. The mask 21 includes a substrate 210, a reflective multi-layer (ML) 220, a capping layer 230, and absorber layer 240. For EUV lithography, the mask 21 includes a binary intensity mask (BIM) and a phase-shifting mask (PSM). The BIM includes an almost totally absorptive region (also referred to as an opaque region) and a reflective region. In the opaque region, an absorber layer is present and an incident light beam is almost fully absorbed by the absorber. In the reflective region, the absorber layer is removed and the incident light is reflected by the reflective multi-layer (ML) structure. A PSM includes an absorptive region and a reflective region. A portion of the incident light reflects from the absorptive region with a proper phase difference with respect to reflected light from the reflective region to enhance the resolution and imaging quality. The PSM can be attenuated PSM (alt. PSM) or alternating PSM (att. PSM). An att. PSM usually has 2%-15% of reflectivity from its absorber, while an alt. PSM usually has larger than 50% of reflectivity from its reflective region The mask 21 includes a low thermal expansion material (LTEM) substrate 210. In some embodiments, the LTEM substrate 210 includes LTEM glass, quartz, silicon, silicon carbide, black diamond, and/or other low thermal expansion substances known in the art. The LTEM substrate 210 minimizes image distortion by mask heating by the intensified illumination radiation. Although not illustrated, a conductive layer is formed on the LTEM substrate 210 for electrostatically coupling the mask 21 to the support structure MT. The conductive layer is formed on the side of the LTEM substrate 210 opposite the side having the multi-layer (ML) 220 (see below). The conductive layer includes chromium nitride (CrN).

A reflective multi-layer (ML) 220 is disposed over the LTEM substrate 210. The reflective multi-layer (ML) 220 includes alternating layers of materials having a high refractive index and a low refractive index. A material having a high refractive index scatters EUV radiation and a material having a low refractive index transmits EUV radiation. Pairing these two type materials together provides a resonant reflectivity. The multi-layer (ML) 220 includes a plurality of film pairs, such as molybdenum-silicon (Mo/Si) film pairs (e.g., a layer of molybdenum above or below a layer of silicon in each film pair). Alternatively the multi-layer (ML) 220 may include molybdenum-beryllium (Mo/Be) film pairs, or any material that is highly reflective at EUV wavelengths. The thickness of each layer of the multi-layer (ML) 220 depends on the EUV wavelength and the incident angle. The thickness of the multi-layer (ML) 220 is adjusted to achieve a maxim constructive interference of the EUV radiation reflected at each interface and a minimum absorption of the EUV radiation by the multi-layer (ML) 220. The multi-layer (ML) 220 may be selected such that it provides a high reflectivity to a selected radiation type/wavelength (e.g., reflectivity of 70%). A typical number of film pairs is 20-80, however any number of film pairs is possible. In an embodiment, the multi-layer (ML) 220 includes forty pairs of layers of Mo/Si. Each Mo/Si film pair has a thickness of 5-7 nm, with a total thickness of 300 nm.

A capping layer 230 is formed on the multi-layer (ML) 220 to prevent oxidation of the multi-layer (ML) during a mask patterning process and an absorber layer repairing process. In addition, the capping layer 230 acts as an etch stop in an absorption layer patterning process. The capping layer 230 has different etch characteristics than the absorption layer. In some embodiments, the capping layer 230 includes ruthenium (Ru) with a 20-80 nm thickness. Alternatively, the capping layer 230 may include silicon dioxide (SiO2), amorphous carbon or other suitable compositions. A low temperature deposition process is often chosen for depositing the capping layer to prevent interdiffusion of the multi-layer (ML) 220.

An absorber layer 240 is formed on the capping layer 230 for absorbing radiation in the EUV wavelength ranges projected onto the mask 21. In some embodiments, the absorption layer 240 has a patterned two-layer structure including, as the lower layer, an exposure light absorbing layer 243 for absorbing the exposure light in the short-wavelength region including the EUV region and, as the upper layer, a low-reflectivity layer 245 for absorbing the inspection light used in inspection of the mask pattern. For the sake of discussion, the different patterns of the absorber layer 240 are labelled as 240-1, 240-2, . . . , 240-7 in FIG. 2. In some embodiments, the exposure light absorbing layer 243 includes low reflectivity tantalum boron nitride (TaBN).

In some embodiments, the low-reflectivity layer 245 includes tantalum boron oxide (TaBO).

A buffer layer (not shown) is formed on the capping layer 230 as an etch stop layer for patterning the absorber layer 240. In some embodiments, the buffer layer may include silicon dioxide ($SiO_2$) or silicon oxynitride (SiON).

One or more of the layers 220, 230, 240 (243, 245) and 250 may be formed by various methods, including a physical vapor deposition (PVD) process, such as evaporation and DC magnetron sputtering; a plating process, such as electrode-less plating or electroplating; a chemical vapor deposition (CVD) process, such as atmospheric pressure CVD (APCVD), low pressure CVD (LPCVD), plasma enhanced CVD (PECVD), or high density plasma CVD (HDP CVD); ion beam deposition; spin-on coating; and/or other methods. The compositions and/or physical structures of one or more layers described above may be selected based upon reflectivity/absorption of the radiation to be used with the mask 21, the stress compatibility with adjacent layers, and/or other criteria.

Although care is taken to utilize defect free substrates for manufacturing EUV masks, intrinsic (or native) defects will be present in the substrates. As illustrated, the LTEM substrate 210 includes a defect 211 located in or on the LTEM substrate 210 and on which the multi-layer structure 220 is arranged. As illustrated in FIG. 2, the defect 211 is a "pit defect", wherein a depression is formed on the surface of the LTEM substrate 210. Alternatively, the defect 211 can be a "bump defect", wherein the surface of the LTEM substrate 210 includes an arching or a protrusion. The defect 211 causes deformation in the multi-layer (ML) 220 formed on the LTEM substrate 210, as indicated at 223. Because of the deformation 223, the surface of the top most layer of the multi-layer (ML) 220 includes a pit defect 231. Pit defects cause a phase shift in the light reflected from the multi-layer 220 that is opposite to the phase shift caused by a bump defect. The bumps or pits on the surface of the LTEM substrate 210 result from particles, scratches, or other localized variations in thickness of the LTEM substrate 210.

Figure 3:
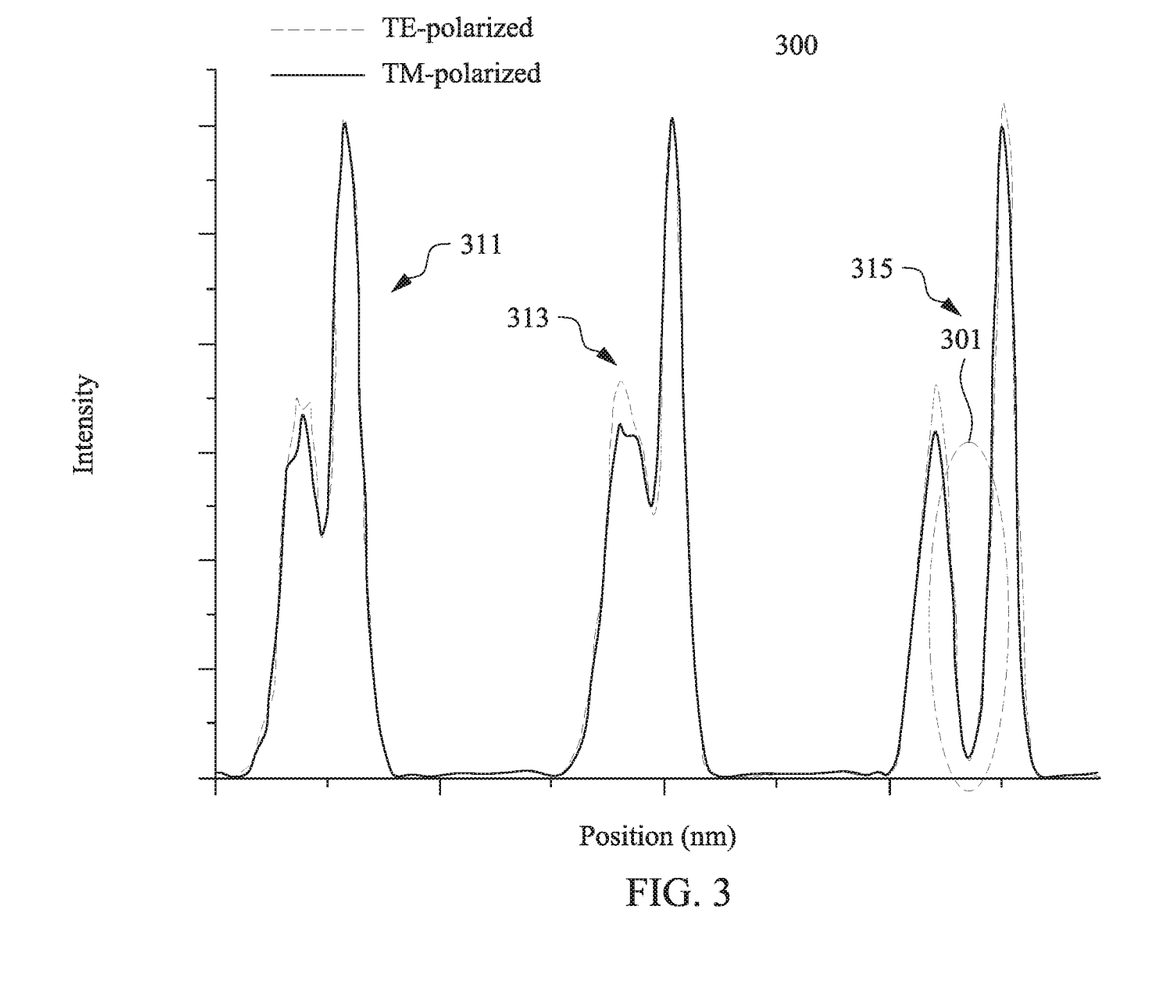
FIG. 3 is a graph that illustrates the variation in the intensity of EUV radiation reflected from the EUV mask in FIG. 1.

FIG. 3 is a graph 300 that illustrates the variation in the intensity of EUV radiation reflected from the mask 21. The position of the absorber layer 240 and pit defect 231 is plotted on the abscissa and the intensity is plotted on the ordinate. The peaks 311 and 313 indicate the variation in the intensity of the EUV radiation reflected from a defect free surface of the multi-layer (ML) 220 between adjacent absorber layers 240. The peaks 311 are due to the EUV radiation reflecting between the absorber layers 240-2 and 240-3, and the peaks 313 are due to the EUV radiation reflecting between the absorber layers 240-3 and 240-4. The peaks 315 are due to the EUV radiation reflecting between the absorber layers 240-4 and 240-5 that include the pit defect 231 therebetween.

The EUV radiation incident on the mask 21 includes transverse electric (TE) polarized light and transverse magnetic (TM) polarized light. As illustrated, the presence of the pit defect 231 causes a dip 301 in the intensity of the EUV radiation reflected from the multi-layer (ML) 220. The reduction in the intensity is low enough to be considered as a dark area and is printed on the semiconductor wafer.

Figure 4:
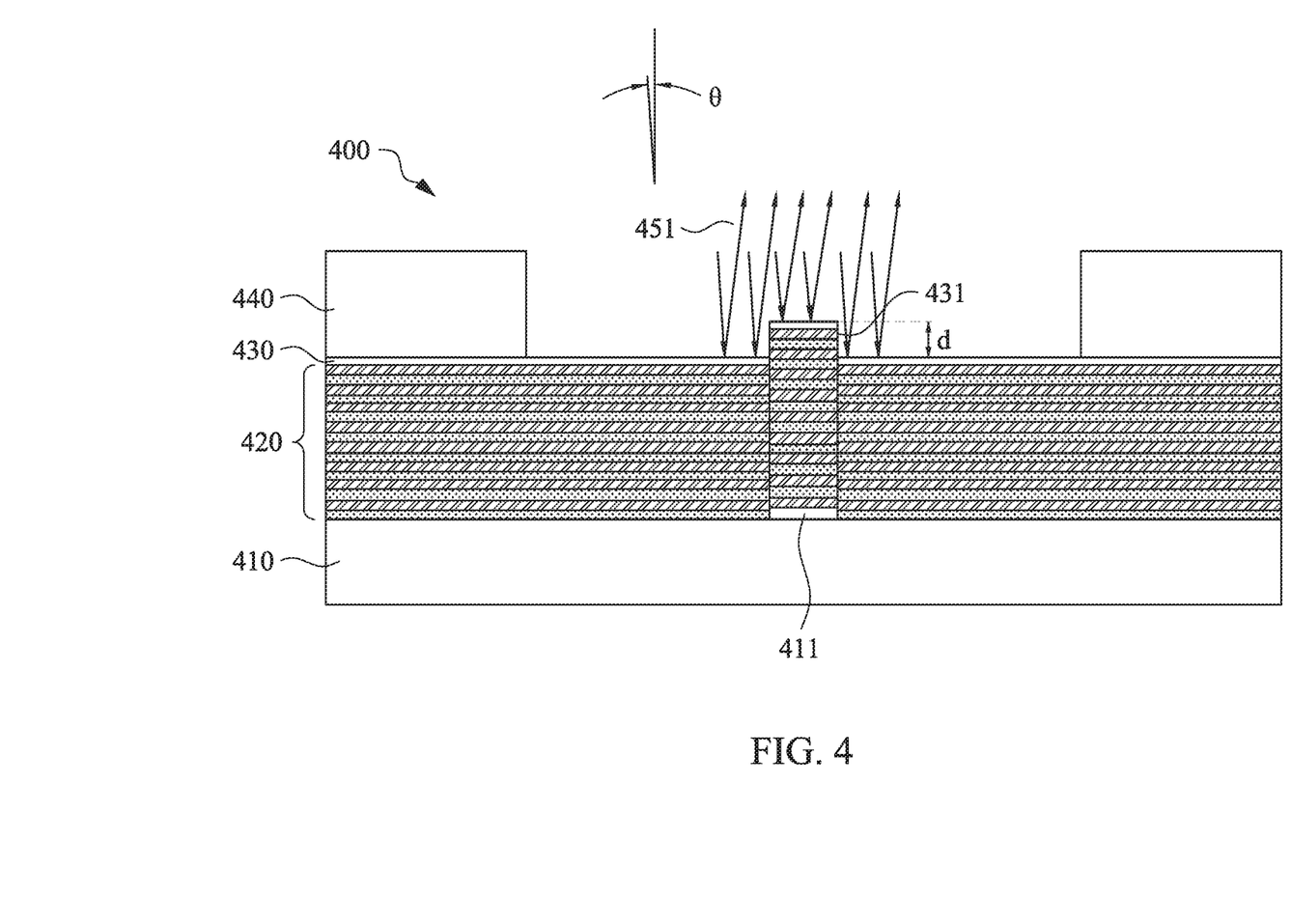
FIG. 4 illustrates a diagrammatic cross-sectional side view of an extreme ultra-violet (EUV) mask including a defect, according to some embodiments.

FIG. 4 illustrates a diagrammatic cross-sectional side view of the extreme ultra-violet (EUV) mask 400. The EUV mask 400 includes a substrate 410, a reflective multi-layer (ML) 420, a capping layer 430, and absorber layer 440. The EUV mask 400 is similar to the EUV mask 21 in FIGS. 1 and 2 in some aspects. However, for the sake of explanation, the substrate 410 and the multi-layer (ML) 420 are shown to have bump defects 411 and 431, respectively. It should be understood that the discussion with reference to the bump defects is equally valid for pit defects.

As illustrated, the bump defect 431 has a height d measured from the surface of the capping layer 430. EUV radiation 451 is incident on the EUV mask 400 (and the bump defect 431) at an angle of incidence θ. The angle of incidence (θ) is obtained by $$\theta = 2\pi\left(\frac{2nd}{\lambda\cos\theta} + p\right) \quad \text{Equation 1}$$

where wavelength (λ) is 13.5 nm, n represents the refractive index, and p is a positive integer greater than zero. Thus, assuming if the height d is zero (absence of bump defect), then the angle of incidence is θ=2πp, which indicates a cyclic nature of the incident EUV radiation.

The height d can be measured, or can be obtained based on the phase difference between the incident EUV radiation and the reflected EUV radiation. For a π phase difference between the incident EUV radiation and the reflected EUV radiation, the height (d) of the bump defect 431 in nanometers (nm) is obtained using by $$d=6.713*(p+2/4)\text{nm} \quad \text{Equation 2}$$

For a π/2 phase difference between the incident EUV radiation and the reflected EUV radiation, the height (d) of the bump defect 431 in nanometers (nm) is obtained using by $$d=6.713*(p+1/4)\text{nm} \quad \text{Equation 3}$$

For a 2π phase difference between the incident EUV radiation and the reflected EUV radiation, the height (d) of the bump defect 431 in nanometers (nm) is obtained using by $$d=6.713p \text{ nm} \quad \text{Equation 4}$$

For a 3π/2 phase difference between the incident EUV radiation and the reflected EUV radiation, the height (d) of the bump defect 431 in nanometers (nm) is obtained using by $$d=6.713*(p+3/4)\text{nm} \quad \text{Equation 5}$$

The π phase difference and the 2π phase difference results in a constructive interference between the incident EUV radiation and the reflected EUV radiation. The π/2 phase difference and the 3π/2 phase difference results in a destructive interference between the incident EUV radiation and the reflected EUV radiation.

Referring to Equation 1, it is understood that by reducing the value of height d, the effect due to the bump defect 431 can be reduced. The height d of the bump defect 431 is dependent on the deformities in the substrate 410 and/or the multi-layer (ML) 420. In addition, heights d of different bump defects on the surface of the multi-layer (ML) 420 are not the same.

Figure 5A:
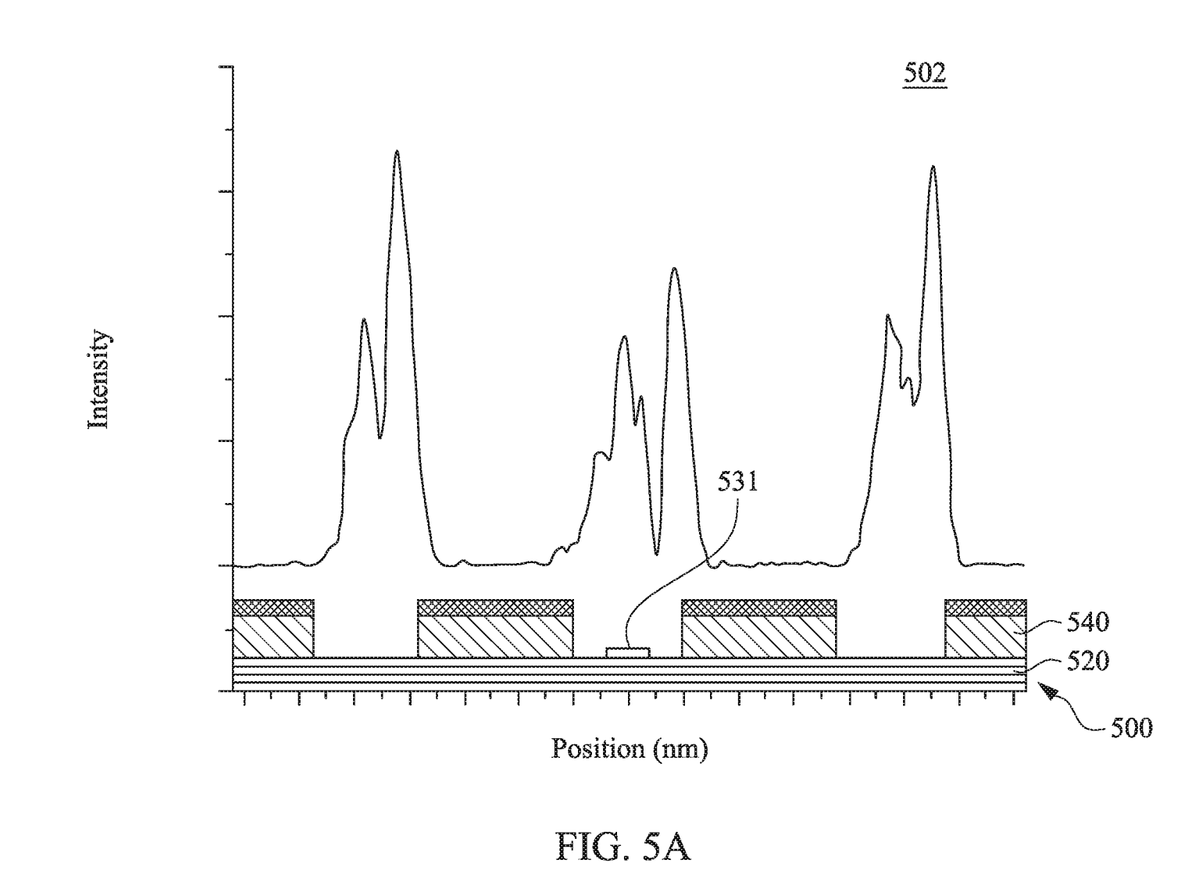
FIGS. 5A and 5B are graphs illustrating the variation in the intensity of the reflected EUV radiation from an EUV mask.
Figure 5B:
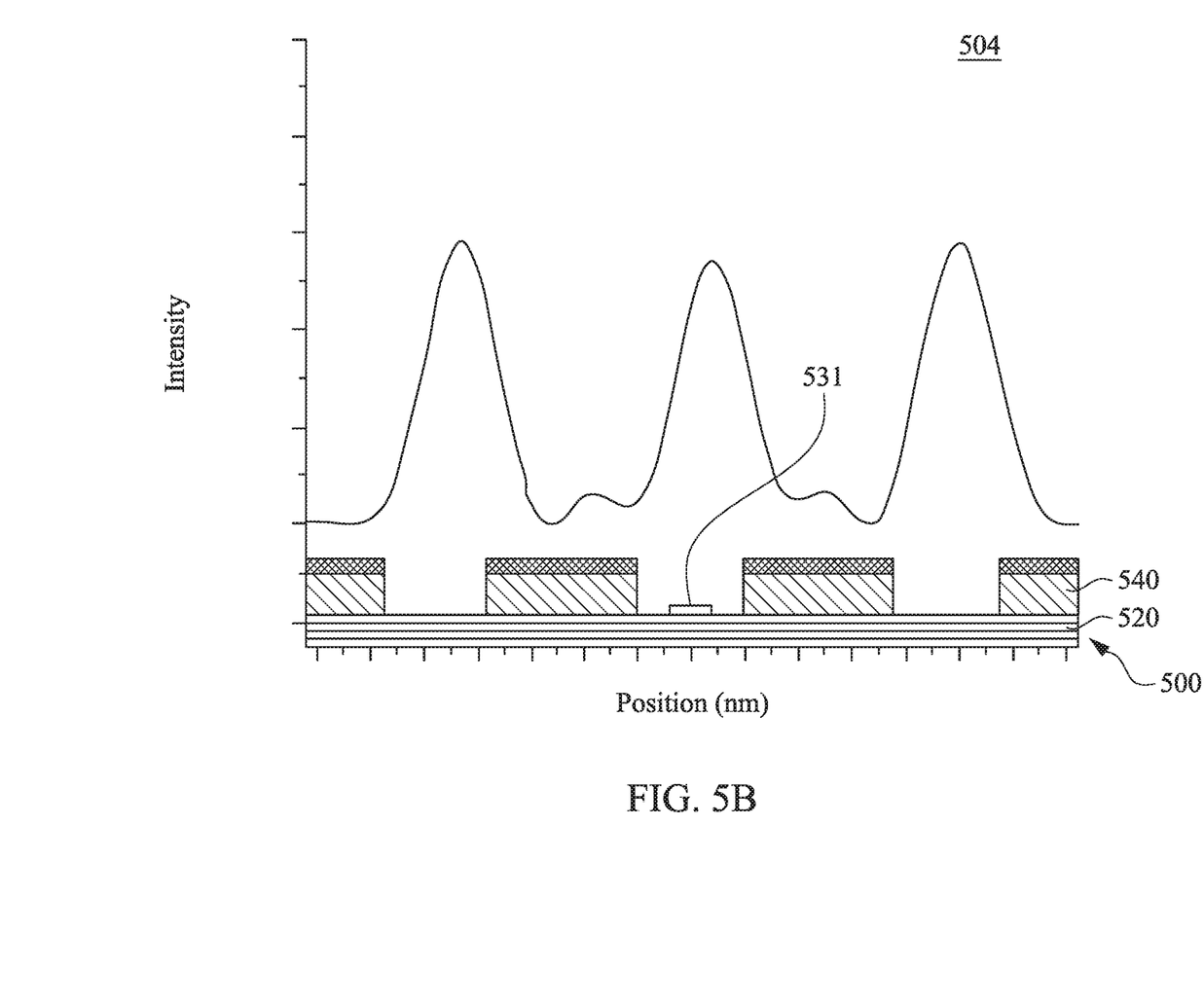

FIGS. 5A and 5B show graphs 502 and 504 illustrating the variation in the intensity of the reflected EUV radiation from an EUV mask 500 having a defect. A portion of the EUV mask 500 is illustrated in each of the graphs 502 and 504. The EUV mask 500 includes a multi-layer (ML) structure 520 including 40 molybdenum-silicon (Mo/Si) film pairs (partly illustrated), and an absorber layer 540. Other features of the EUV mask 500 may be similar to the EUV mask 400 in FIG. 4. A bump defect 531 is included on the surface of the topmost film of the multi-layer (ML) structure 520.

Graph 502 illustrates the variation in the intensity of the reflected EUV radiation measured by a EUV scanner having a numerical aperture (NA) of 1. Graph 504 illustrates the variation in the intensity of the reflected EUV radiation measured by a EUV scanner having a numerical aperture (NA) of 0.25.

As illustrated, the variation in the intensity of the reflected EUV radiation measured by the EUV scanner having NA=1 (graph 502) is more than the variation in the intensity of the reflected EUV radiation measured by the EUV scanner having NA=0.25 (graph 504). In addition, the decrease in the intensity of reflected EUV radiation due to the bump defect 531 as measured by the EUV scanner having NA=1 (graph 502) is more than the decrease in the intensity of reflected EUV radiation due to the bump defect 531 as measured by the EUV scanner having NA=0.25 (graph 504). Stated otherwise, even in the presence of the bump defect 531, the EUV scanner having a smaller NA measures relatively higher intensity light. Thus, when using the EUV scanner having the smaller NA, the area having the bump defect 231 is seen as bright area and circuit design in the area is transferred to the semiconductor wafer during exposure.

The numerical aperture (NA) of the EUV scanner is one of many factors that determine the critical dimension (CD) of the features transferred to the semiconductor wafer. Some other factors include the size of the defect, the pitch, dimension on mask (DOM), the EUV scanner environment, and multi-layer (ML) deposition process to reduce the deformities in the multi-layer (ML).

Embodiments disclosed are directed to reducing the refractive index n of the environment around the EUV mask using a plasma. By reducing the refractive index, the numerical aperture of the EUV scanner is reduced and an effect on the semiconductor wafer due to defects on the EUV mask is reduced. Defects on the EUV mask reduce intensity of the reflected EUV radiation from an area of the EUV mask having the defect. An effect on the semiconductor wafer due to the reduced intensity radiation is that the area having the defect appears dark. By reducing the refractive index, the intensity of the reflected EUV radiation is increased and thus the area having the defect is determined as bright area.

In some embodiments, plasma (e.g., high density plasma) is generated in the reticle stage (RS) of the extreme ultraviolet lithography system (e.g., system 100, FIG. 1) in the environment around the EUV mask 21 such that the EUV mask 21 is exposed to the plasma when EUV radiation is incident on the EUV mask 21 during the lithography process. The plasma is generated at or adjacent the mask support structure MT (FIG. 1) including the EUV mask 21 in order to expose the EUV mask to the generated plasma. By reducing the refractive index, the intensity of reflected EUV radiation from the area of the EUV mask having the defect is increased and the area is determined as a bright area.

Figure 6:
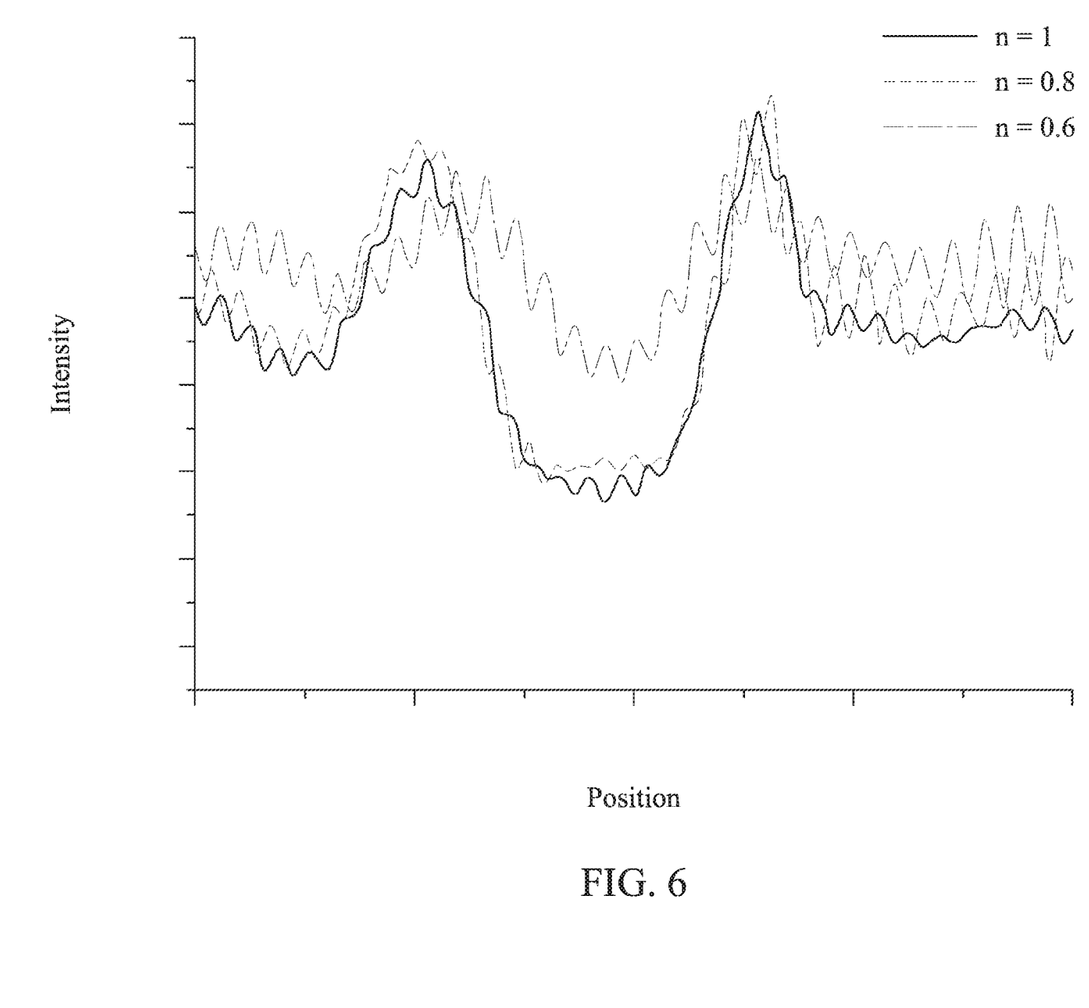
FIG. 6 is a graph that illustrates variation in the intensity of reflected EUV radiation for different values of refractive index n.

FIG. 6 is a graph 600 that illustrates variation in the intensity of reflected EUV radiation for different values of refractive index n. It is observed in graph 600 that the variation in the intensity is less when the refractive index is 0.6 compared to when the refractive index is 1 and 0.8. Stated otherwise, the smaller the refractive index n, the smaller the probability of the occurrence of optically destructive interference. In an embodiment, a plasma density (or plasma ion density) of about $4.4 \times 10^{30}$ ions/m$^3$ results in a refractive index n of 0.6. In some embodiments, the plasma is generated in the environment around the reticle stage of the extreme ultraviolet lithography system (e.g., the mask support structure MT of the system 100, FIG. 1).

In order to generate plasma, a gas is flowed into the environment around the reticle stage. The gas is delivered from a gas supply, such as a tank. In some embodiments, the gas is delivered via a pipe or tube, of a suitable material such as steel, from the supply. In some embodiments, the gas is flowed into at a flow rate in a range from about 200 sccm (standard cubic centimeters per minute) to about 9000 sccm. In some embodiments, the flow rate varies depending on the plasma source and/or the particular process. In some embodiments, the gas includes $O_2$, $N_2$, $H_2$, He, Ar, $CF_4$, NF3, Kr, $C_xH_yF_z$, or a mixture of some or all of these gases. The gas is ignited to generate plasma including $O_2$, $N_2$, $H_2$, He, Ar, $CF_4$, NF3, Kr, $C_xH_yF_z$, or a compound plasma including a mixture of some or all of these gases. In some embodiments, the gas is ignited via radio frequency (RF) power source (e.g., about 13.56 MHz or other suitable RF) or a microwave (MW) power source. In some embodiments, the gas is ignited by an inductively coupled plasma (ICP) plasma source in which the energy is supplied by electric currents produced by electromagnetic induction using time varying magnetic fields. The plasma includes plasma effluents, such as ionized, excited, and/or neutral species of the gas. The generated plasma occupies the environment around the reticle stage such that the EUV mask is exposed to the plasma. In some embodiments, the plasma density is about $2 \times 10^{25}$ ions/m$^3$ to about $2 \times 10^{35}$ ions/m$^3$ results in the refractive index n in the range of 0.5 to 0.8. The relationship between numerical aperture (NA) and the refractive index (n) and the pitch (P) is given by $$P = \frac{\lambda}{2 \cdot n \cdot NA} \qquad \text{Equation 6}$$

It is thus understood that the higher the refractive index, the lesser is the pitch.

The illustrated extreme ultraviolet lithography system 100 uses a reflective EUV mask 21. However, embodiments disclosed herein are not limited to only reflective lithography systems and are equally applicable to transmissive lithography systems in which the EUV mask is a transmissive mask.

Figure 7:
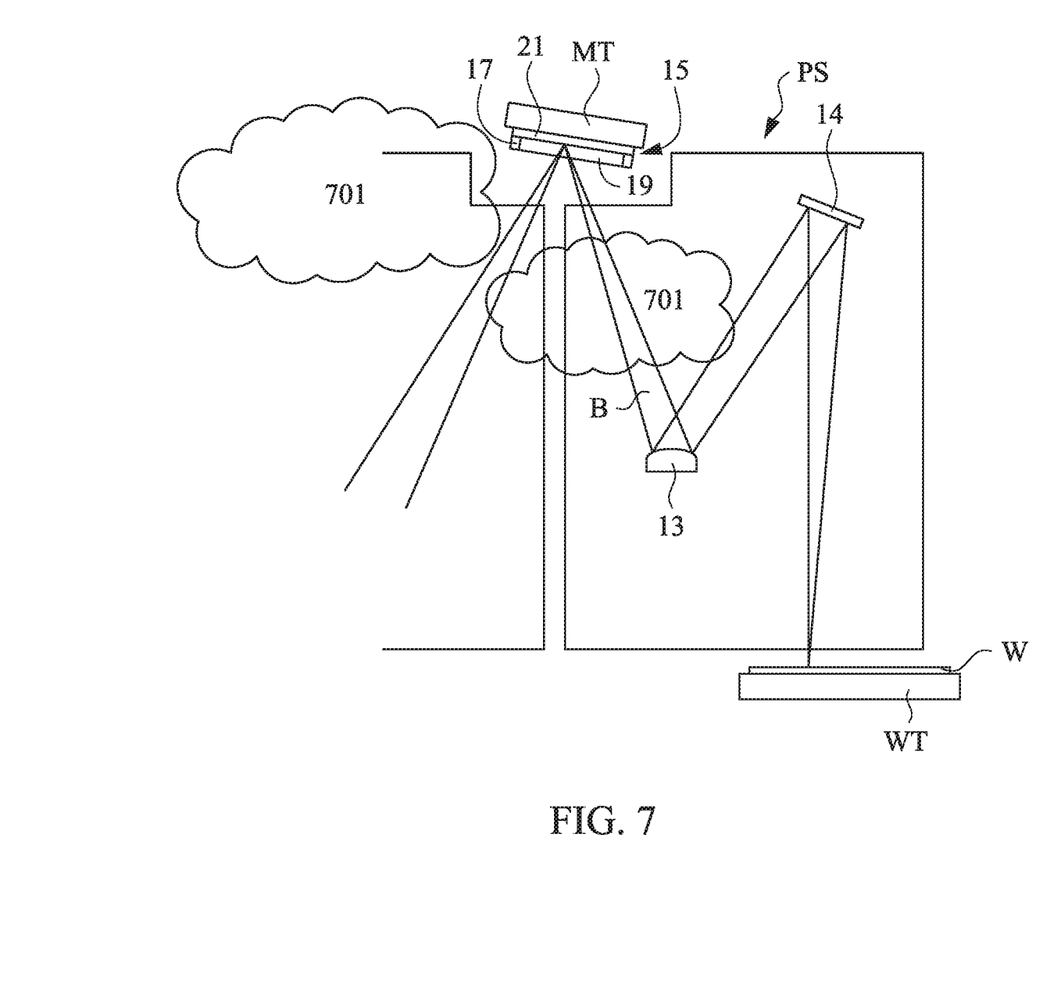
FIG. 7 illustrates location of the plasma adjacent the mask support structure MT (e.g., chuck) of the extreme ultraviolet lithography system in FIG. 1.

FIG. 7 illustrates location 701 of the plasma adjacent the mask support structure MT (e.g., chuck) of the extreme ultraviolet lithography system 100 in FIG. 1.

The plasma frequency $\omega_p$ is determined by $$\epsilon = 1 - \frac{\omega_p^2}{\omega^2} \qquad \text{Equation 7}$$

wherein, $\epsilon$ is the permittivity of the environment around the mask, $\omega_p$ is the plasma frequency, and $\omega$ is the operational frequency. For an increased permittivity, the plasma frequency must be less than the operational frequency.

The plasma frequency $\omega_p$ is determined by $$\omega_p = \sqrt{\frac{n_e e^2}{\epsilon_0 m_e}} \qquad \text{Equation 8}$$

wherein, $n_e$ is the electron concentration, e is electron charge, $\epsilon_0$ permittivity of free space, and $m_e$ electron mass.

Figure 8:
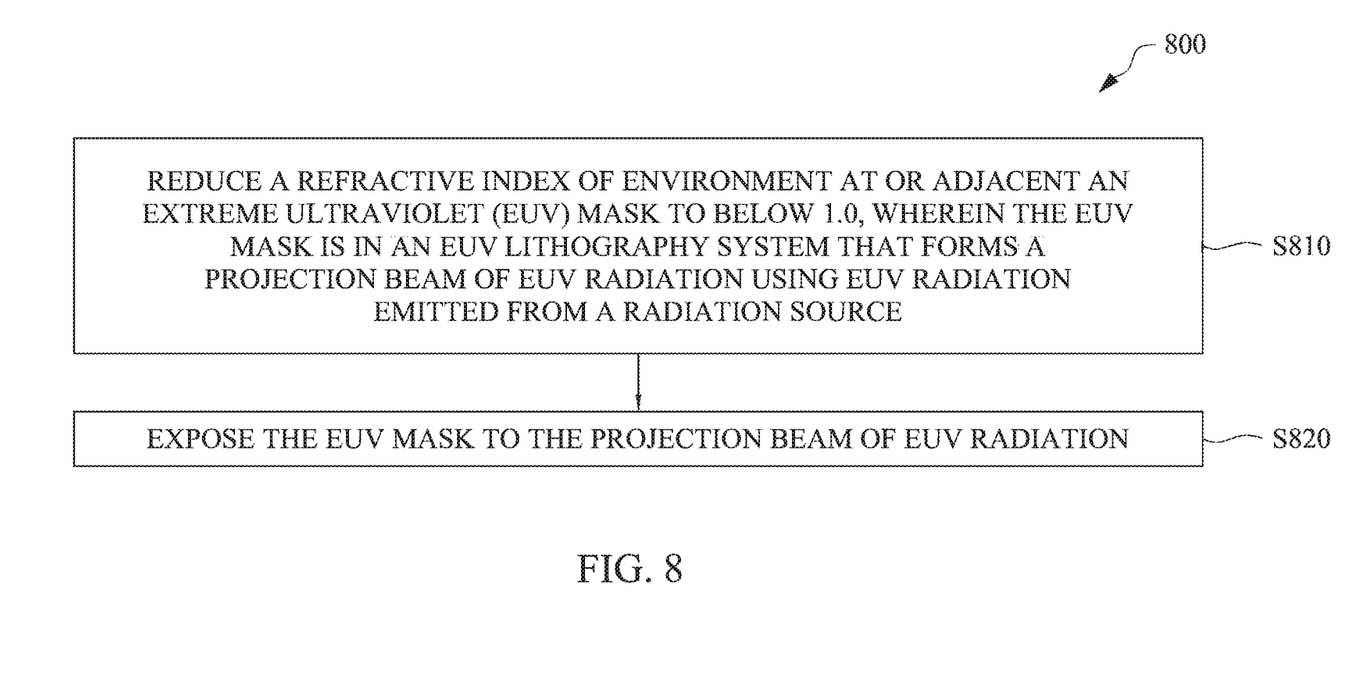
FIG. 8 is a flowchart of a method of reducing a refractive index of the environment around an EUV mask installed in an EUV lithography system, according to some embodiments.

An embodiment of the present disclosure is a method 800 of reducing a refractive index of the environment around an EUV mask installed in an EUV lithography system according to the flowchart illustrated in FIG. 8. It is understood that additional operations can be provided before, during, and after operations discussed in FIG. 8, and some of the operations described below can be replaced or eliminated, for additional embodiments of the method. The order of the operations may be interchangeable and at least some of the operations may be performed in a different sequence. At least two or more operations may be performed overlapping in time, or almost simultaneously.

The method 800 includes an operation S810 of reducing refractive index of an environment at or adjacent an extreme ultraviolet (EUV) mask to below 1.0. The EUV mask is in an EUV lithography system that forms a projection beam of EUV radiation using EUV radiation emitted from a radiation source. In some embodiments, plasma is generated in the environment around the EUV mask when exposing the EUV mask to the EUV radiation. The plasma reduces the refractive index of the environment to below 1.0. The method 800 further includes an operation S820 of exposing the EUV mask to the projection beam of EUV radiation.

Figure 9:
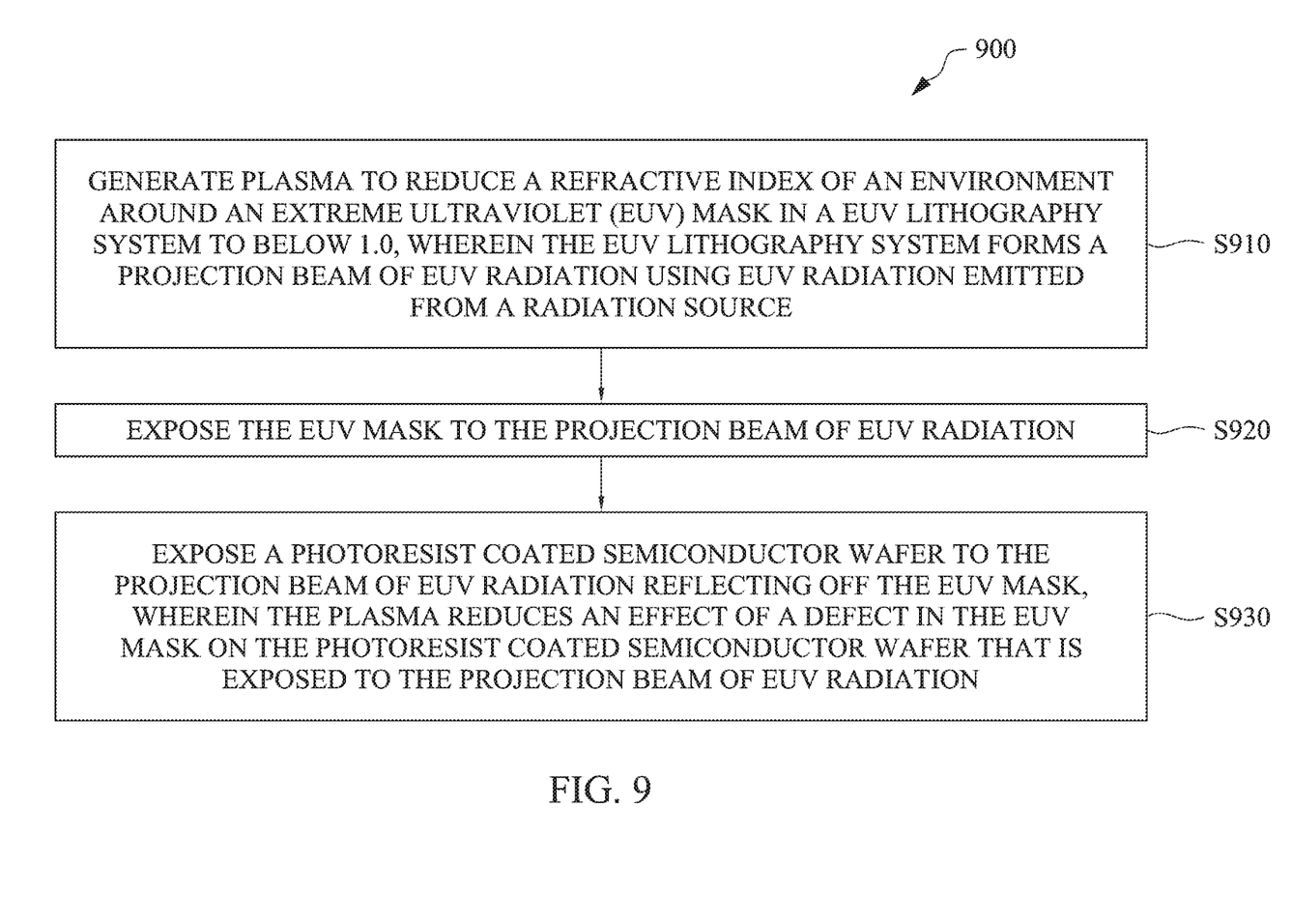
FIG. 9 is a flowchart of another method of reducing a refractive index of the environment around an EUV mask installed in an EUV lithography system, according to some embodiments.

An embodiment of the present disclosure is a method 900 of reducing a refractive index of the environment around an EUV mask installed in an EUV lithography system according to the flowchart illustrated in FIG. 9. It is understood that additional operations can be provided before, during, and after operations discussed in FIG. 9, and some of the operations described below can be replaced or eliminated, for additional embodiments of the method. The order of the operations may be interchangeable and at least some of the operations may be performed in a different sequence. At least two or more operations may be performed overlapping in time, or almost simultaneously.

The method 900 includes an operation S910 of generating plasma to reduce a refractive index of an environment around an extreme ultraviolet (EUV) mask in an EUV lithography system to below 1.0. The EUV lithography system forms a projection beam of EUV radiation using EUV radiation emitted from a radiation source. In operation S920, the EUV mask is exposed to the projection beam of EUV radiation. In operation S930, a photoresist coated semiconductor wafer is exposed to the projection beam of EUV radiation reflecting off the EUV mask. The plasma reduces the refractive index of the environment and, as mentioned above, reduces an effect of a defect in the EUV mask on the photoresist coated semiconductor wafer that is exposed to the projection beam of EUV radiation.

Figure 10:
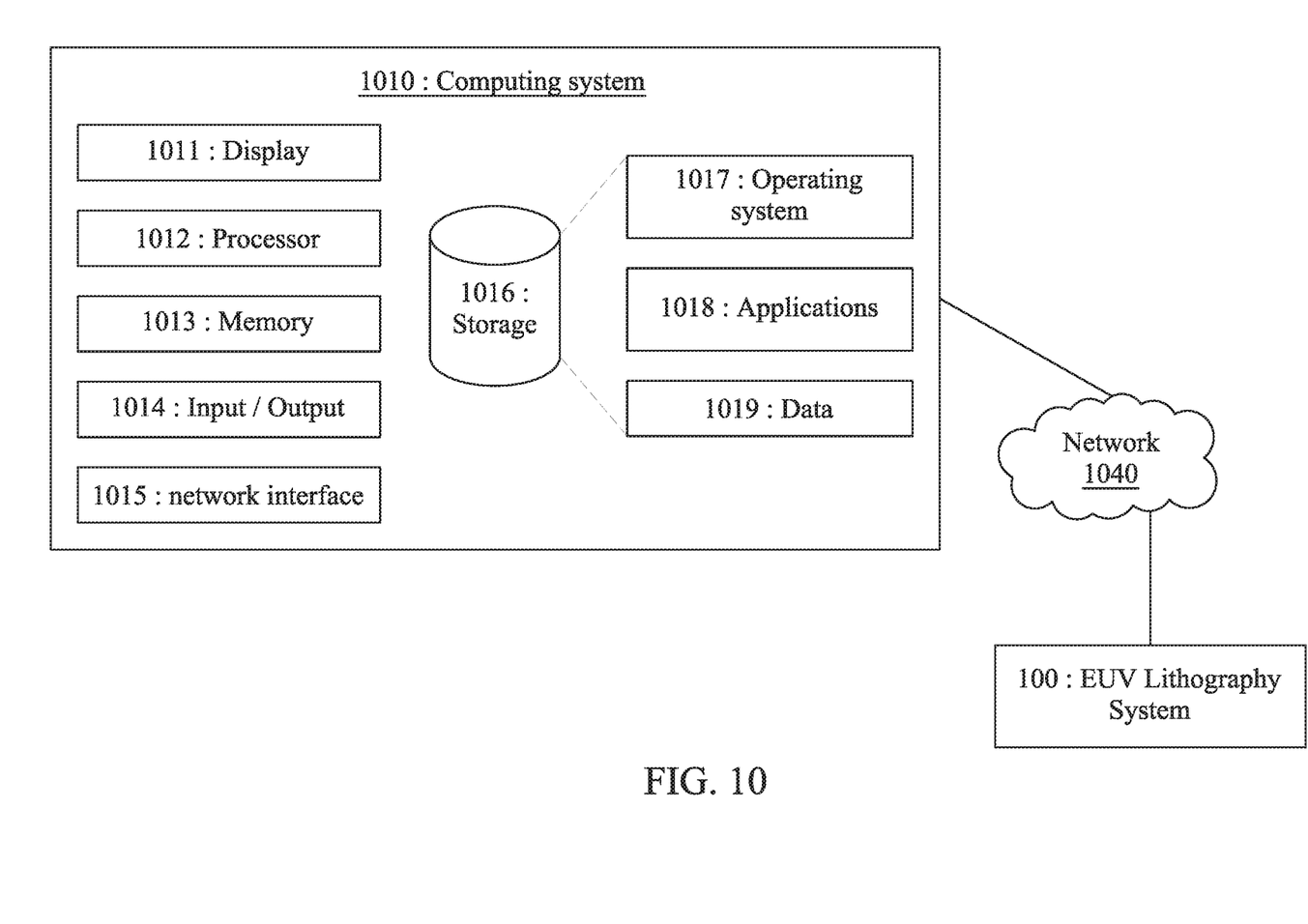
FIG. 10 is a block diagram illustrating a computing device for controlling an operation of the extreme ultraviolet lithography system in FIG. 1 and generation of plasma, according to some embodiments.

FIG. 10 is a block diagram illustrating a computing device 1010 for controlling an operation of the extreme ultraviolet lithography system 100 illustrated in FIG. 1 and plasma generation of, according to some embodiments. In some embodiments, the computing device 1010 is implemented using hardware or a combination of software and hardware, either in a dedicated server, integrated into another entity, or distributed across multiple entities.

The computing device 1010 is communicably connected to the extreme ultraviolet lithography system 100 using a wireless or wired network 1040 to permit data exchange therebetween.

The computing device 1010 includes a display 1011, a processor 1012, a memory 1013, an input/output interface 1014, a network interface 1015, and a storage 1016 storing an operating system 1017, programs or applications 1018, such as an application for controlling the operations of the EUV lithography system 100 and plasma generation, and data 1019. The processor 1012 can be a general-purpose microprocessor, a microcontroller, a digital signal processor (DSP), an application specific integrated circuit (ASIC), a field-programmable gate array (FPGA), a programmable logic device (PLD), a controller, a state machine, gated logic, discrete hardware components, or any other suitable entity that can perform calculations or other manipulations of information. The storage 1016 can be a random access memory (RAM), a flash memory, a read-only memory (ROM), a programmable read-only memory (PROM), an erasable PROM (EPROM), registers, a hard disk, a removable disk, a CD-ROM, a DVD, or any other suitable storage device, for storing information and instructions to be executed by processor 1012. The processor 1012 and storage 1016 can be supplemented by, or incorporated in, special purpose logic circuitry.

The network interface 1015 includes networking interface cards, such as Ethernet cards and modems. In some embodiments, the input/output interface 1014 is configured to connect to a plurality of devices, such as an input device and/or an output device. Input devices include a keyboard and a pointing device, e.g., a mouse or a trackball, by which a user can provide input to the computing device 1010. Other kinds of input devices are used to provide for interaction with a user as well, such as a tactile input device, visual input device, audio input device, or brain-computer interface device. For example, feedback provided to the user can be any form of sensory feedback, e.g., visual feedback, auditory feedback, or tactile feedback; and input from the user can be received in any form, including acoustic, speech, tactile, or brain wave input. Output devices include display devices, such as an LED (light emitting diode), CRT (cathode ray tube), or LCD (liquid crystal display) screen, for displaying information to the user.

The applications 1018 can include instructions which, when executed by the computing device 1010 (or the processor 1012 thereof), causes the computing device 1010 (or the processor 1012 thereof) to control the extreme ultraviolet lithography system 200 and plasma generation, and perform other operations, methods, and/or processes that are explicitly or implicitly described in the present disclosure.

The data 1019 can include data including default parameters used in the control operations, data that is received, for example, through the input/output interface 1014 or through the network interface 1015 transmitted from the extreme ultraviolet lithography system 200, data for displaying on the display 1011, data that is transmitted to or from the extreme ultraviolet lithography system 200 via the network 1040, or data generated during operation of the computing device 1010.

Embodiments disclosed provide numerous advantages over existing methods that only rely on substrate and/or ML flattening. By reducing the refractive index of the environment around the EUV mask, the effects on the semiconductor wafer due to the defects can be further reduced.

An embodiment of the disclosure is a method that includes reducing refractive index of an environment at or adjacent an extreme ultraviolet (EUV) mask to below 1.0. In an embodiment, the EUV mask is in an EUV lithography system that forms a projection beam of EUV radiation using EUV radiation emitted from a radiation source. The EUV mask is exposed to the projection beam of EUV radiation. In an embodiment, a plasma is generated in the environment to reduce the refractive index of the environment at or adjacent the EUV mask. In an embodiment, the EUV mask includes a substrate and a multi-layer (ML) structure formed on the substrate, and one or more of the substrate and multi-layer (ML) structure includes a defect. In an embodiment, the generated plasma reduces destructive optical interference caused by the defect. In an embodiment, the generated plasma reduces an effect of the defect on a semiconductor wafer that is exposed to the projection beam of EUV radiation. In an embodiment, the plasma has a density between $2\times10^{25}$ ions/m$^3$ to $2\times10^{35}$ ions/m$^3$. In an embodiment, the plasma is generated adjacent the EUV mask. In an embodiment, the refractive index of the environment includes is reduced to about 0.5-0.8.

An embodiment of the disclosure is an extreme ultraviolet (EUV) lithography system that includes an extreme ultraviolet (EUV) radiation source, a collector for collecting EUV radiation and focusing the EUV radiation, a reticle stage supporting an EUV mask, and plasma adjacent the reticle stage, the plasma reducing a refractive index of an environment of the EUV mask to below 1.0. In an embodiment, the EUV mask includes a substrate and a multi-layer (ML) structure formed on the substrate, and one or more of the substrate and multi-layer (ML) structure includes a defect. In an embodiment, the plasma reduces destructive optical interference caused by the defect. In an embodiment, the plasma reduces an effect of the defect on a semiconductor wafer that is exposed to the EUV radiation. In an embodiment, the plasma has a density between $2\times10^{25}$ ions/m$^3$ to $2\times10^{35}$ ions/m$^3$. In an embodiment, the plasma reduces the refractive index of the environment around the EUV mask to about 0.5-0.8. In an embodiment, the plasma is located adjacent the EUV mask. In an embodiment, the EUV mask is a reflective mask. In an embodiment, the plasma increases an intensity of EUV radiation reflecting from a location of the EUV mask that includes the defect.

Another embodiment of the disclosure is a method that includes generating plasma to reduce a refractive index of an environment around an extreme ultraviolet (EUV) mask in an EUV lithography system to below 1.0. The EUV lithography system forms a projection beam of EUV radiation using EUV radiation emitted from a radiation source. The EUV mask is exposed to the projection beam of EUV radiation. A photoresist coated semiconductor wafer is exposed to the projection beam of EUV radiation reflecting off the EUV mask. The plasma reduces an effect of a defect in the EUV mask on the photoresist coated semiconductor wafer that is exposed to the projection beam of EUV radiation. In an embodiment, generating the plasma includes generating plasma having a density between $2\times10^{25}$ ions/m$^3$ to $2\times10^{35}$ ions/m$^3$. In an embodiment, the refractive index of the environment is reduced to between 0.5 and 0.8. In an embodiment.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   reducing refractive index of an environment at or adjacent an extreme ultraviolet (EUV) mask, wherein the EUV mask is in an EUV lithography system that forms a projection beam of EUV radiation using EUV radiation emitted from a radiation source; and
   exposing the EUV mask to the projection beam of EUV radiation, wherein the refractive index of the environment is reduced to between 0.5-0.8.

2. The method of claim 1, wherein reducing the refractive index of the environment at or adjacent the EUV mask comprises generating a plasma in the environment.

3. The method of claim 2, wherein the EUV mask includes a substrate and a multi-layer (ML) structure formed on the substrate, and one or more of the substrate and multi-layer (ML) structure includes a defect.

4. The method of claim 3, wherein the generated plasma reduces destructive optical interference caused by the defect.

5. The method of claim 3, wherein generating the plasma in the environment reduces an effect of the defect on a semiconductor wafer that is exposed to the projection beam of EUV radiation.

6. The method of claim 2, wherein generating the plasma includes generating plasma having a density between $2\times10^{25}$ ions/m$^3$ to $2\times10^{35}$ ions/m$^3$.

7. The method of claim 2, wherein the plasma is generated adjacent the EUV mask.

8. An extreme ultraviolet (EUV) lithography system, comprising:
   an extreme ultraviolet (EUV) radiation source;
   a collector for collecting EUV radiation and focusing the EUV radiation;
   a reticle stage supporting an EUV mask; and
   a plasma adjacent the reticle stage, the plasma reducing a refractive index of an environment around the EUV mask, wherein the plasma reduces the refractive index of the environment around the EUV mask to between 0.5-0.8.

9. The EUV lithography system of claim 8, wherein the EUV mask includes a substrate and a multi-layer (ML) structure formed on the substrate, and one or more of the substrate and multi-layer (ML) structure includes a defect.

10. The EUV lithography system of claim 9, wherein the plasma reduces destructive optical interference caused by the defect.

11. The EUV lithography system of claim 9, wherein the plasma reduces an effect of the defect on a semiconductor wafer that is exposed to the EUV radiation.

12. The EUV lithography system of claim 9, wherein the plasma increases an intensity of EUV radiation reflecting from a location of the EUV mask that includes the defect.

13. The EUV lithography system of claim 8, wherein the plasma has a density between $2\times10^{25}$ ions/m$^3$ to $2\times10^{35}$ ions/m$^3$.

14. The EUV lithography system of claim 8, wherein the plasma is located adjacent the EUV mask.

15. The EUV lithography system of claim 8, wherein the EUV mask is a reflective mask.

16. A method, comprising:
   generating plasma to reduce a refractive index of an environment around an extreme ultraviolet (EUV) mask in an EUV lithography system to below 1.0, wherein the plasma has a density between $2\times10^{25}$ ions/m$^3$ to $2\times10^{35}$ ions/m$^3$, and the EUV lithography system forms a projection beam of EUV radiation using EUV radiation emitted from a radiation source;
   exposing the EUV mask to the projection beam of EUV radiation; and
   exposing a photoresist coated semiconductor wafer to the projection beam of EUV radiation reflecting off the EUV mask, wherein the plasma reduces an effect of a defect in the EUV mask on the photoresist coated semiconductor wafer that is exposed to the projection beam of EUV radiation.

17. The method of claim 16, wherein the refractive index of the environment is reduced to between 0.5 and 0.8.

18. The method of claim 16, wherein the plasma is generated from one or more gases of $O_2$, $N_2$, $H_2$, He, Ar, $CF_4$, NF3, Kr or $C_xH_yF_z$.

19. The method of claim 18, wherein the one or more gases is supplied at a flow rate in a range from 200 sccm to 9000 sccm.

20. The method of claim 16, wherein the plasma is generated by one of a radio frequency (RF) power source or a microwave (MW) power source.

* * * * *